United States Patent
Chen et al.

(10) Patent No.: US 9,478,467 B2
(45) Date of Patent: Oct. 25, 2016

(54) SEMICONDUCTOR DEVICE INCLUDING POWER AND LOGIC DEVICES AND RELATED FABRICATION METHODS

(71) Applicants: Weize Chen, Phoenix, AZ (US); Richard J. De Souza, Chandler, AZ (US); Patrice M. Parris, Phoenix, AZ (US)

(72) Inventors: Weize Chen, Phoenix, AZ (US); Richard J. De Souza, Chandler, AZ (US); Patrice M. Parris, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/543,668

(22) Filed: Nov. 17, 2014

(65) Prior Publication Data

US 2016/0141211 A1    May 19, 2016

(51) Int. Cl.
| | |
|---|---|
| H01L 21/82 | (2006.01) |
| H01L 21/8236 | (2006.01) |
| H01L 21/8234 | (2006.01) |
| H01L 27/088 | (2006.01) |

(52) U.S. Cl.
CPC ... *H01L 21/8236* (2013.01); *H01L 21/823418* (2013.01); *H01L 27/0883* (2013.01)

(58) Field of Classification Search
CPC .................. H01L 21/2253; H01L 21/823456; H01L 21/823462; H01L 21/28123; H01L 29/1033; H01L 29/7833; H01L 29/78261; H01L 29/7835; H01L 29/41; H01L 29/4232
See application file for complete search history.

(56) References Cited

U.S. PATENT DOCUMENTS

| | | |
|---|---|---|
| 4,149,904 A | 4/1979 | Jones |
| 4,182,023 A | 1/1980 | Cohen et al. |
| 4,682,404 A | 7/1987 | Miller et al. |
| 5,650,343 A | 7/1997 | Luning et al. |
| 6,140,186 A | 10/2000 | Lin et al. |
| 6,274,443 B1 * | 8/2001 | Yu .................... H01L 21/266 257/E21.206 |

* cited by examiner

*Primary Examiner* — Armando Rodriguez

(57) ABSTRACT

Semiconductor device structures and related fabrication methods are provided. An exemplary fabrication method involves forming a layer of gate electrode material overlying a semiconductor substrate, forming a layer of masking material overlying the gate electrode material, and patterning the layer of masking material to define a channel region within a well region in the semiconductor substrate that underlies the gate electrode material. Prior to removing the patterned layer of masking material, the fabrication process etches the layer of gate electrode material to form a gate structure overlying the channel region using the patterned layer of masking material as an etch mask and forms extension regions in the well region using the patterned layer of masking material as an implant mask. Thereafter, the patterned layer of masking material is removed after forming the gate structure and the extension regions.

17 Claims, 5 Drawing Sheets

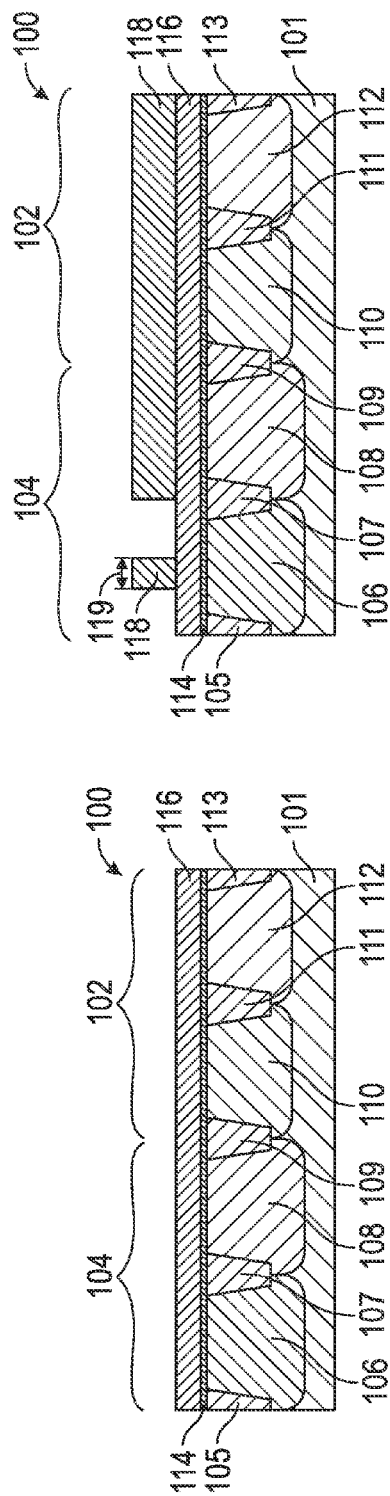
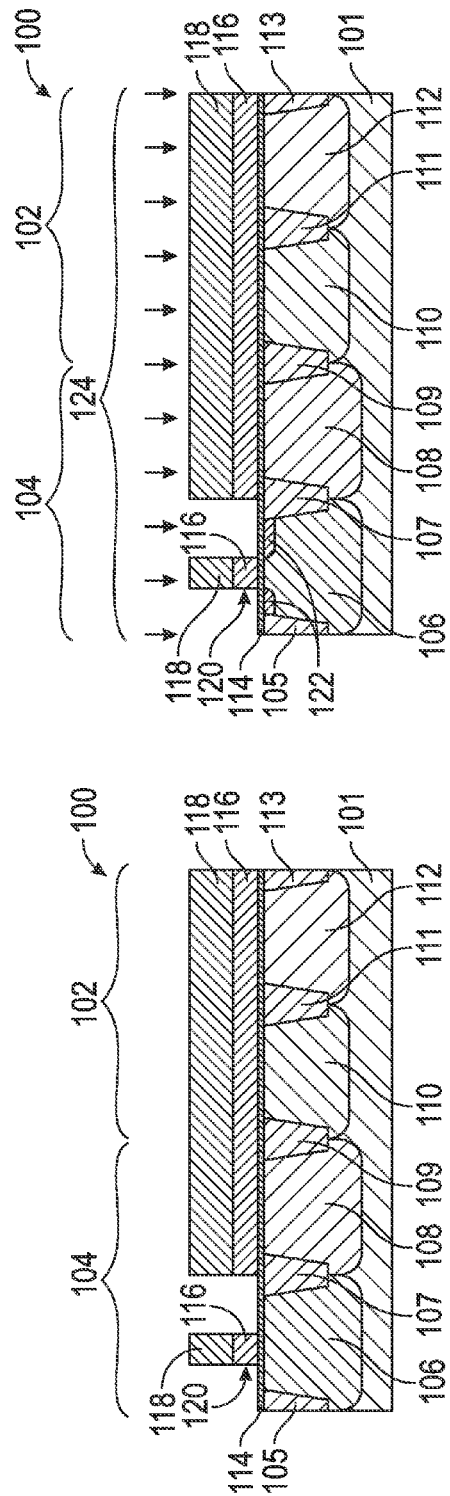

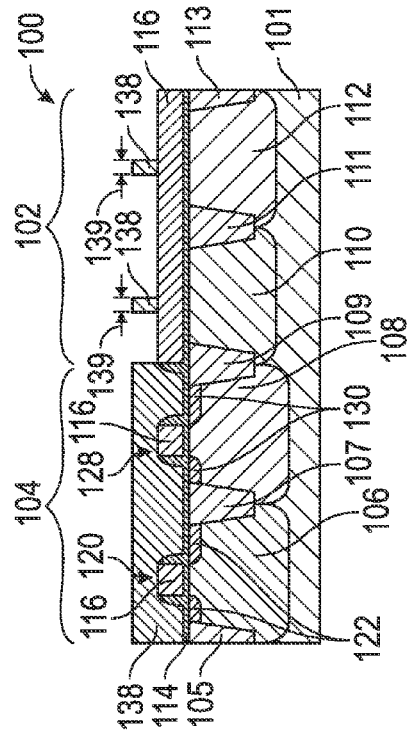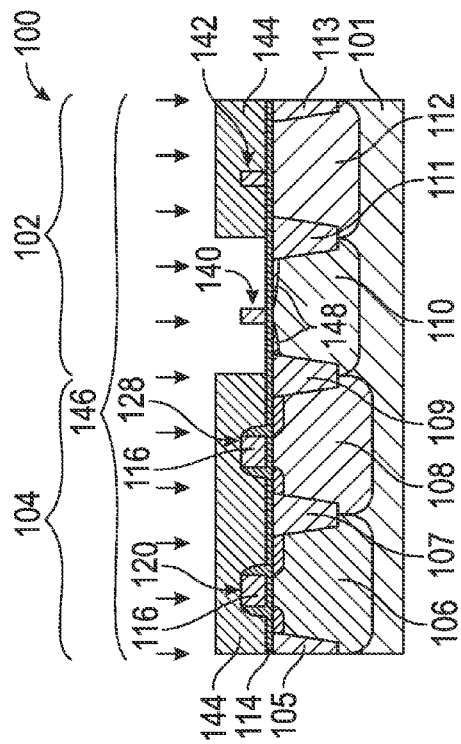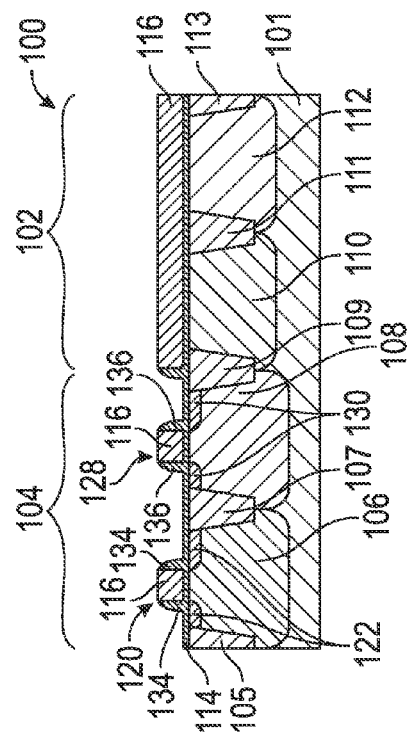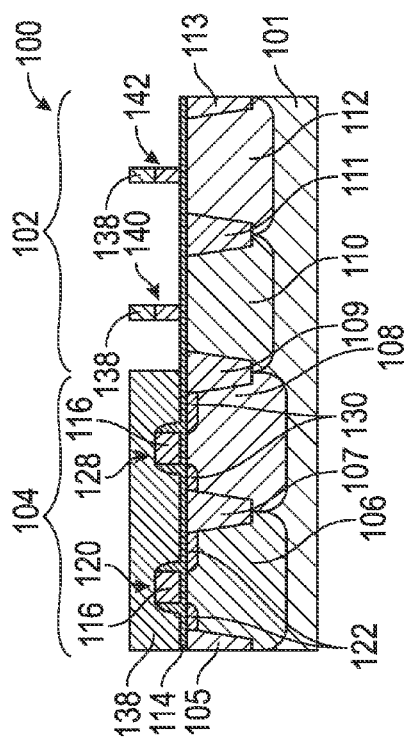

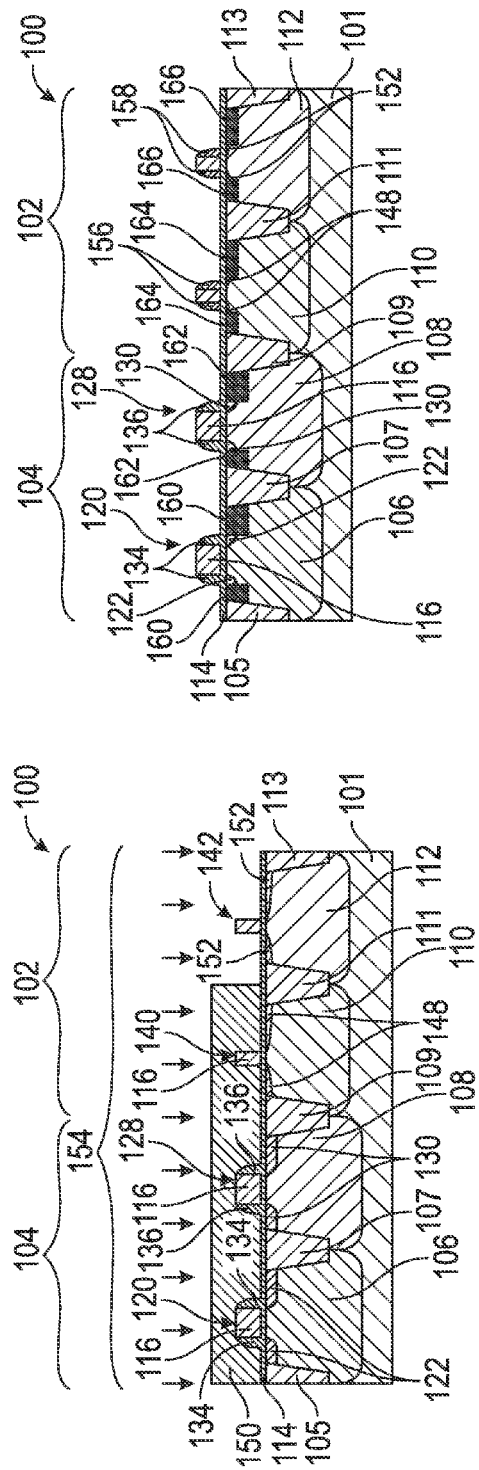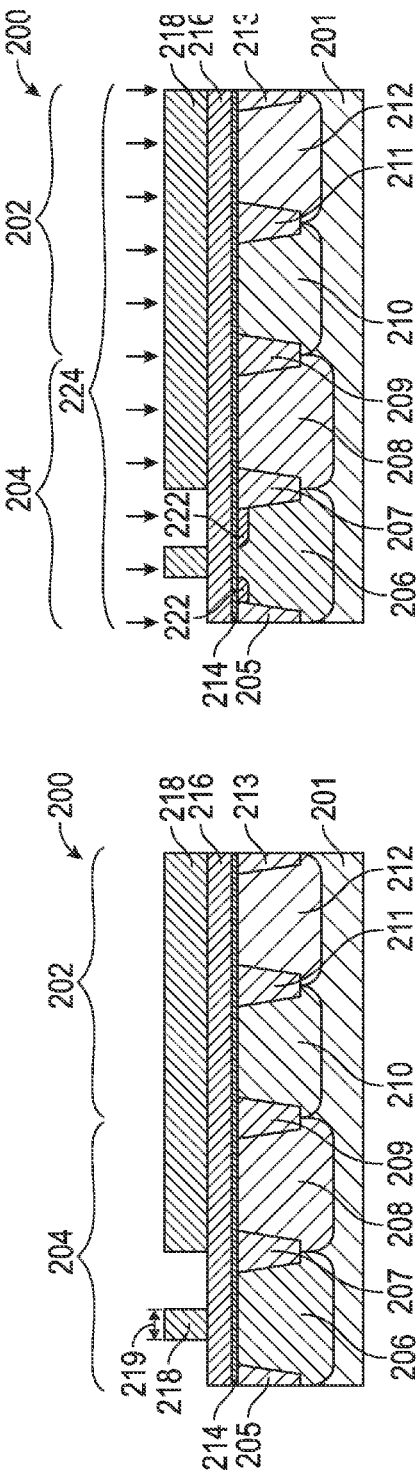

US 9,478,467 B2

SEMICONDUCTOR DEVICE INCLUDING POWER AND LOGIC DEVICES AND RELATED FABRICATION METHODS

TECHNICAL FIELD

Embodiments of the subject matter described herein relate generally to semiconductor devices and methods for fabricating semiconductor devices, and more particularly, embodiments of the subject matter relate to methods for fabricating semiconductor devices having thinner gate stacks without compromising voltage capabilities.

BACKGROUND

Efforts to continually decrease the size of transistors and/or other semiconductor devices introduce challenges when integrating devices with different power handling capabilities on a common die. For example, memory devices may include a number of relatively low power semiconductor devices for storing data while also including relatively higher power semiconductor devices that support the various read, write, and erase operations. As device geometries decrease to enable smaller or more densely distributed lower power devices for increased storage capabilities, the power handling capabilities of the higher power semiconductor devices also decrease without modifications to the fabrication process or the device structure to compensate for the decreased device geometries. However, such modifications often undesirably increase the cost or complexity of the fabrication process, or otherwise compromise performance in an unintended manner. Thus, what is needed is a simple and cost effective means for maintaining power handling capabilities of higher power devices without sacrificing performance as device geometries decrease.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, which are not necessarily drawn to scale.

FIGS. 1-14 illustrate, in cross section, a semiconductor device structure and exemplary methods for fabricating transistor structures on the semiconductor device structure in accordance with one or more embodiments of the invention; and FIGS. 15-18 illustrate, in cross section, methods for fabricating transistor structures on a semiconductor device structure in accordance with one or more alternate embodiments of the invention.

DETAILED DESCRIPTION

Figure 5:
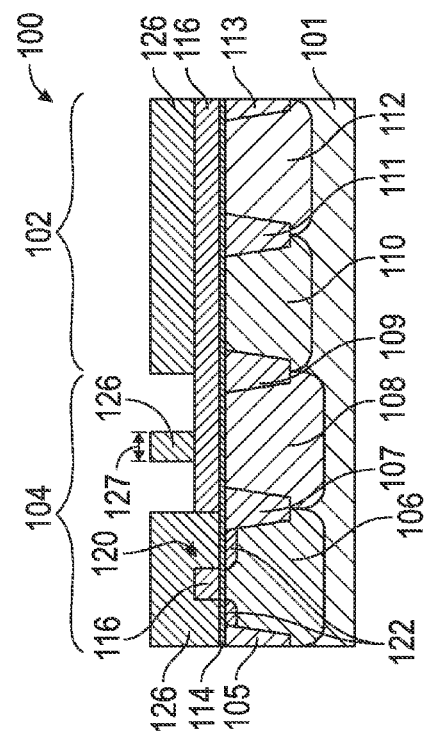

Embodiments of the present invention relate to semiconductor devices and related methods for fabricating a semiconductor device that include both higher power transistors and lower power logic transistors on a common semiconductor substrate or die. In this regard, the same fabrication process steps are used to form the gate electrode material for both the higher power transistors and lower power transistors, such that the thickness of the portions of gate electrode material in the gate stacks of the higher power transistors is substantially equal to the thickness of the portions of gate electrode material in the gate stacks of the lower power transistors. However, to avoid punch-through, reduce leakage, increase breakdown voltage, and provide the desired higher power handling capabilities, the depth of the source/drain extension regions for the higher power transistors is greater than the depth of the source/drain extension regions for the lower power transistors. In one or more exemplary embodiments described herein the depth of the source/drain extension regions for the higher power transistors is greater than the height (or thickness) of the gate stacks of the higher power transistors. In other words, for a particular higher power transistor structure, the depth of the extension regions formed about its gate structure is greater than a sum of the thickness of the portion(s) of dielectric material(s) in the gate structure and the thickness of the portion(s) of gate electrode material(s) in the gate structure. Additionally, the extension regions for the higher power transistors may be formed without using spacers to offset the extension regions from the gate structures, such that the interior lateral boundaries of respective extension regions may be vertically aligned with the gate structure of that respective higher power transistor structure. In this regard, the fabrication processes described herein allow for forming source/drain extension regions for the higher power transistors with the desired depth and alignment relative to the gate stacks of the higher power transistors in a manner that ensures the channel regions underlying their gate stacks are not undesirably doped when forming the source/drain extensions.

FIGS. 1-14 illustrate, in cross-section, methods for fabricating a semiconductor device structure 100 on a semiconductor substrate 101 in accordance with one or more exemplary embodiments. In exemplary embodiments, the semiconductor device structure 100 includes a first region 102 of the semiconductor substrate 101 having a plurality of transistor structures (and potentially other semiconductor devices) fabricated thereon, which are configured to provide a desired functionality for the semiconductor device structure 100. Additionally, the semiconductor device structure 100 includes a second region 104 of the semiconductor substrate 101 having one or more transistor structures (and potentially other semiconductor devices) fabricated thereon, which are configured to provide a desired level of power handling capability to support the functionality of the transistors and/or other semiconductor devices on the first region 102. In one embodiment, the semiconductor device structure 100 is a memory device, where the transistor structures on the first region 102 are lower voltage devices configured to support reading and/or writing data to/from memory cells of the memory device, with the transistor structures on the second region 104 being higher voltage devices configured to provide a voltage and/or current that supports erasing, rewriting, or other operations with respect to the memory cells. For purposes of explanation, but without limitation, the first region 102 may alternatively be referred to herein as the device region or logic region, the second region 104 may alternatively be referred to herein as the higher voltage (HV) region, the transistor structures fabricated on the HV region 104 may alternatively be referred to herein as higher voltage (HV) transistors, and the transistor structures fabricated on the device region 102 may alternatively be referred to herein as logic transistors.

Although FIGS. 1-14 depict the semiconductor substrate 101 as a bulk substrate of semiconductor material (e.g., silicon, silicon admixed with other elements, or the like), it should be understood that the fabrication process described herein is not constrained by the type of substrate and/or the type of semiconductor material utilized, and the fabrication processes described herein may also be used to create devices from an isolated semiconductor substrate (e.g., a silicon-on-insulator (SOI) substrate). Additionally, although the subject matter is described herein in the context of a complementary metal-oxide-semiconductor (CMOS) device, the subject matter is not intended to be limited to CMOS semiconductor devices, and may be utilized with other MOS semiconductor devices which are not CMOS semiconductor devices. Although "MOS" properly refers to a device having a metal gate electrode and an oxide gate insulator, the subject matter may be utilized with any semiconductor device that includes a conductive gate electrode (whether metal or other conductive material) that is positioned with respect to a gate insulator (whether oxide or other insulator) which, in turn, is positioned with respect to a semiconductor substrate to implement a field-effect transistor, and the subject matter is not intended to be limited to a metal gate electrode and an oxide gate insulator. Various steps in the manufacture of MOS devices are well known and so, in the interest of brevity, many conventional steps will only be mentioned briefly herein or will be omitted entirely without providing the well-known process details.

Referring now to FIG. 1, the illustrated fabrication process begins by forming well regions 106, 108, 110, 112 and isolation regions 105, 107, 109, 111, 113 in the semiconductor substrate 101. The well regions 106, 108, 110, 112 may be formed in a conventional manner, for example, by masking regions of the semiconductor substrate 101 with an implant mask having a desired pattern and implanting ions of the desired conductivity type and dopant concentration at a desired energy level to achieve well regions 106, 108, 110, 112 having the desired depth, conductivity type, and dopant concentration. For example, a P-type body well region 106 for an N-type HV transistor may be formed by masking the device region 102 and the portion(s) of the HV region 104 that will be utilized for N-type body well region(s) 108 of the P-type HV transistor(s) and implanting P-type ions into the exposed region 106 of the semiconductor substrate 101. Similarly, the N-type body well region 108 may be formed by masking the device region 102 and the P-type body well region 106 and implanting N-type ions into the exposed region 108 of the semiconductor substrate 101. Likewise, N-type body well region(s) 112 and P-type body well region(s) 110 may be formed in the device region 102 by appropriately masking the HV region 104 and portions of the device region 102.

In the illustrated embodiment, the depths of the HV transistor well regions 106, 108 are substantially equal to one another and greater than the depth of the logic transistor well regions 110, 112 to support higher voltages than the logic transistor well regions 110, 112. That said, in alternative embodiments, the depths of the HV transistor well regions 106, 108 may be different from one another, or the depths of the HV transistor well regions 106, 108 may be less than or equal to the depth of the logic transistor well regions 110, 112. Additionally, in exemplary embodiments, the dopant concentrations of the HV transistor well regions 106, 108 are different from the dopant concentrations of the logic transistor well regions 110, 112. In this regard, depending on the embodiment, the dopant concentrations of the HV transistor well regions 106, 108 may be greater than or less than the dopant concentrations of the logic transistor well regions 110, 112. In one or more embodiments, the body well regions 106, 108 of the HV transistors have a dopant concentration that is less than the dopant concentration of the well regions 110, 112 of the logic transistors to support higher voltages than the logic transistor well regions 110, 112. For example, the body well regions 106, 108 of the HV transistors may have a dopant concentration in the range of about $1 \times 10^{16}/cm^3$ to about $2 \times 10^{17}/cm^3$, while the well regions 110, 112 of the logic transistors may have a dopant concentration in the range of about $5 \times 10^{16}/cm^3$ to about $1 \times 10^{18}/cm^3$. In one or more embodiments, the logic transistor well regions 110, 112 have a depth relative to the upper surface of the semiconductor substrate 101 that is less than or equal to 1.5 µm, while the HV transistor well regions 106, 108 have a depth relative to the upper surface of the semiconductor substrate 101 that is greater than that of the logic transistor well regions 110, 112. In exemplary embodiments, the depth of the transistor well regions 106, 108 relative to the upper surface of the semiconductor substrate 101 is greater than 0.7 µm.

Either before or after forming the well regions 106, 108, 110, 112, the isolation regions 105, 107, 109, 111, 113 may be formed in the semiconductor substrate 101 to isolate adjacent devices from one another. For example, shallow trench isolation (STI) may be performed to form the isolation regions 105, 107, 109, 111, 113 by etching trenches in the semiconductor substrate 101 and forming a dielectric material, such as oxide material, in the trenches. In one or more exemplary embodiments described herein, the isolation regions 105, 107, 109, 111, 113 have a depth relative to the upper surface of the semiconductor substrate 101 in the range of about 0.25 µm to about 0.35 µm. In this regard, the depth of the isolation regions 105, 107, 109, 111, 113 is greater than the depth of source/drain extension regions subsequently formed in the well regions 106, 108, 110, 112, as described in greater detail below.

Still referring to FIG. 1, after forming the well regions 106, 108, 110, 112 and isolation regions 105, 107, 109, 111, 113, the fabrication process continues by forming one or more layers of dielectric material(s) 114 overlying the semiconductor substrate 101 and forming one or more layers of conductive (or semiconductive) material(s) 116 overlying the dielectric material 114. In this regard, the conductive material 116 functions as the conductive gate electrode material of subsequently-formed gate electrode structures overlying the well regions 106, 108, 110, 112 and the underlying dielectric material 114 functions as the gate insulator. While the subject matter may be described herein in the context of an individual layer of dielectric material 114 and an individual layer of gate electrode material 116 in the gate stacks of the transistors for purposes of explanation, it will be appreciated that practical embodiments may include any number of dielectric materials and/or conductive materials in the gate stacks (e.g., high-k dielectric materials, work function setting materials, and/or the like).

In accordance with one or more embodiments, the dielectric material 114 is realized as an oxide material, such as silicon dioxide, that is grown or otherwise formed by oxidizing the exposed surfaces of the semiconductor substrate 101, for example, by performing thermal oxidation by exposing the device structure 100 to an oxidizing ambient at an elevated temperature to promote selective growth of oxide material on the exposed surfaces of the semiconductor substrate 101. In one or more exemplary embodiments, the thickness of the dielectric material 114 overlying the HV region 104 is greater than the thickness of the dielectric material 114 overlying the device region 102. For example, a relatively thicker dielectric layer 114 for the HV region 104 having a thickness in the range of about 10 nanometers (or 100 Angstroms) to about 20 nanometers (or 200 Angstroms) may be formed across the substrate 101 and selectively etched from the device region 102. Thereafter, a relatively thinner dielectric layer 114 having a thickness in the range of about 2 nanometers (or 20 Angstroms) to about 3 nanometers (or 30 Angstroms) may be formed overlying the device region 102 of the semiconductor substrate 101. Formation of the relatively thinner dielectric layer 114 on the device region 102 may also incrementally increase the thickness of the dielectric layer 114 on the HV region 104, as will be appreciated in the art.

After the dielectric material 114 is formed, the conductive material 116 may be formed by conformally depositing a conductive material, such as a polycrystalline silicon material, by chemical vapor deposition (CVD) or another suitable deposition process to a substantially uniform thickness across the different regions 102, 104 of the substrate 101. In this regard, to reduce process cost and/or complexity, the same fabrication process is used to form the conductive gate electrode material for both the HV transistors on the HV region 104 and the logic transistors on the device region 102. In exemplary embodiments described herein, the thickness of the conductive material 116 is less than about 100 nanometers, and in some embodiments, less than 60 nanometers thick. Thus, the thickness of the conductive material 116 may be optimized for purposes of the performance of the logic transistors rather than the HV transistors, or the thickness of the conductive material 116 may otherwise be chosen to achieve an aspect ratio with a desired level of manufacturability.

Referring now to FIGS. 2-3, the fabrication process continues by forming a layer of masking material 118 overlying the layer of conductive material 116 and patterning the masking material 118 to define a gate structure 120 overlying the HV transistor well region(s) 106 having a first conductivity type. In this regard, the portions of the masking material 118 overlying the device region 102 and the HV transistor well region(s) 108 having the opposite conductivity type are maintained intact. Portions of the masking material 118 overlying the peripheral portions of the well region 106 are removed to expose portions of the underlying conductive material 116, while the portion of the masking material 118 overlying the interior (or central) portion of the HV transistor well region 106 remains intact to define the gate structure 120 overlying a channel region within the HV transistor well region 106. In exemplary embodiments, the masking material 118 is realized as a photoresist material that is uniformly applied across the semiconductor device structure 100, for example, via spin coating or another suitable technique. Thereafter, portions of the photoresist material 118 overlying peripheral portions of the well region(s) 106 are removed using photolithography, resulting in the patterned mask depicted in FIGS. 2-4. In one or more embodiments, the width 119 of the remaining portion of masking material 118 overlying the interior portion of the HV transistor well region(s) 106 is configured to provide a gate structure 120 having a length corresponding to that width 119. In exemplary embodiments described herein, the length of the gate structure 120 (or the width 119) is greater than or equal to about 0.5 micrometers (or microns).

Referring now to FIGS. 3-4, in the illustrated embodiment, the patterned masking material 118 is utilized as both an etch mask for forming the gate structure 120 overlying the HV transistor well region 106 as well as an implant mask for forming source/drain extension regions 122 about the gate structure 120 within the HV transistor well region 106 prior to removing the masking material 118. In this regard, the photoresist material 118 is applied to an initial thickness that results in the remaining photoresist material 118 after etching the conductive material 116 having a remaining thickness that prevents the source/drain extension implantation from penetrating the gate structure 120 to the underlying channel portion of the HV transistor well region 106. In exemplary embodiments described herein, the photoresist material 118 is applied to a thickness greater than about 100 nm (or 1000 Angstroms), and typically in the range of about 100 nm to about 1000 nm.

As depicted in FIG. 3, the illustrated fabrication process selectively removes exposed portions of the conductive material 116 using an anisotropic (or directional) etch process to form the gate structure 120 corresponding to the patterned masking material 118. For example, exposed portions of polysilicon material 116 may be anisotropically etched by plasma-based reactive ion etching (RIE) using an anisotropic etchant chemistry. The patterned masking material 118 prevents the anisotropic etching process from removing portions of the conductive material 116 overlying the other HV transistor well region(s) 108 and the device region 102 while the exposed portions of the conductive material 116 that do not underlie the masking material 118 are removed. Thus, the etching results in a portion of the conductive material 116 within the gate structure 120 that is vertically aligned with the portion of photoresist material 118 overlying the well region 106, and the portion of conductive material 116 within the gate structure 120 has a thickness (or height) corresponding to the thickness of the layer 116. The photoresist material 118 is preferably resistant to the anisotropic etchant chemistry and/or has a thickness such that the remaining thickness of the photoresist material 118 after etch process is sufficient to prevent doping of the channel portion of the well region 106 underlying the gate structure 120, as described in greater detail below. In an exemplary embodiment, the exposed conductive material 116 is etched using the mask 118 at least until the dielectric material 114 is exposed.

In one or more embodiments, portions of the dielectric material 114 exposed by the patterned masking material 118 are also selectively removed using an anisotropic etchant. For example, the same etchant chemistry and/or etch process used to remove portions of the conductive material 116 may be utilized to remove exposed portions of the dielectric material 114 overlying the peripheral portions of the well region 106 to a thickness that is substantially equal to the thickness of the portions of the dielectric material 114 overlying the device region 102. In this regard, the thickness of the dielectric material 114 of the gate structure 120 may be maintained at the original thickness of about 10 nm or more to support a desired threshold voltage and/or gate voltage for the N-type HV transistor(s), while the thickness of the surrounding exposed dielectric material 114 may be reduced to a thickness in the range of about 2 nm or 3 nm corresponding to the thickness of the dielectric material 114 on the device region 102. In practice, the HV transistors are likely to experience higher gate voltage and higher drain voltages during operation, and therefore, the gate dielectric material 114 of the gate structure 120 is thicker to support such higher voltages without dielectric breakdown within the gate structure 120. Thus, the remaining portion of photoresist material 118 overlying the well region 106 preserves in a portion of the dielectric material 114 within the gate structure 120 that underlies and is vertically aligned with the portion of the conductive material 116 in the gate structure 120, and the portion of dielectric material 114 within the gate structure 120 has a thickness (or height) corresponding to the thickness of the dielectric layer 114 overlying the well region 106 prior to the etching. In some embodiments, the exposed dielectric material 114 may be completely removed to expose the upper surfaces of the well region 106 that surround the gate structure 120.

Referring now to FIG. 4, after etching the exposed conductive material 116 to form the gate structure 120, fabrication of the semiconductor device structure 100 continues by forming source and drain extension regions 122 within the exposed portions of the well region 106 about the gate structure 120. In this regard, N-type source and drain extension regions 122 may be formed in the P-well region 106 by implanting N-type ions (illustrated by arrows 124), such as phosphorous ions, into the exposed well region 106 for the NMOS HV transistor to a desired depth and/or sheet resistivity using the gate structure 120 and the overlying masking material 118 as an implantation mask. For example, N-type ions may be implanted 124 with a dopant concentration that is greater than $1 \times 10^{16}/cm^3$, and typically between about $1 \times 10^{17}/cm^3$ to about $5 \times 10^{18}/cm^3$ at an energy level in the range of about 25 kiloelectron volt (keV) to about 50 keV to provide extension regions 122 having a junction depth greater than 0.1 microns. In one example embodiment, the extension regions 122 have a junction depth substantially equal to 0.2 microns and a peak dopant concentration of $2 \times 10^{18}/cm^3$ to provide a breakdown voltage greater than 14 Volts. In this regard, in some embodiments, the junction depth of the extension regions 122 is greater than the combined thickness of the remaining portions of the dielectric material 114 and the conductive material 116 in the gate structure 120. For example, in one embodiment, the gate dielectric material 114 may have a thickness of about 15 nm and the gate conductive material 116 may have a thickness of about 60 nm, with the junction depth of the extension regions 122 being equal to about 200 nm (0.2 microns). By virtue of the portion of photoresist material 118 overlying the gate structure 120, the relatively higher energy level implantation 124 does not penetrate through the gate structure 120 (e.g., the underlying conductive material 116 and dielectric material 114) to undesirably dope the P-type well region 106 underlying the gate structure 120. Accordingly, extension regions 122 having internal lateral boundaries vertically aligned with the gate structure 120 (e.g., by virtue of a spacerless extension implant process) may be formed with a junction depth greater than the height or thickness of the gate structure 120 without doping the channel region underlying the gate structure 120. That said, in some embodiments, the implants may be angled to provide extension regions 122 that extend underneath at least a portion of the gate structure 120 in the event subsequent annealing processes by themselves do not result in the extension regions 122 having internal lateral boundaries vertically aligned with the gate structure 120 diffusing underneath the gate structure 120 by the desired amount.

Figure 6:
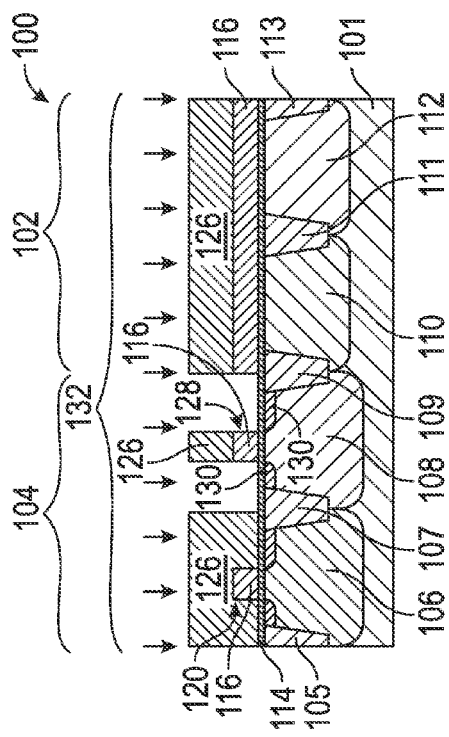

Referring now to FIGS. 5-6, after forming the gate structure 120 and extension regions 122 overlying the well region 106, the illustrated fabrication process continues by removing the masking material 118 from the semiconductor device structure 100, forming another layer of masking material 126 overlying the semiconductor device structure 100, and patterning the masking material 126 to define a gate structure 128 overlying the other HV transistor well region(s) 108 having the opposite conductivity type. The photoresist material 118 may be removed (or stripped) by a photoresist removal process using commonly known solvent chemistries, such as acetone, that remove the photoresist material 118 and leaves the dielectric material 114, the conductive material 116 and/or the substrate material 101 intact. Another layer of photoresist material 126 may then be uniformly applied across the semiconductor device structure 100 and patterned using photolithography to expose portions of the underlying conductive material 116 overlying peripheral portions of the well region 108 while a portion of the masking material 118 overlying the interior (or central) portion of the well region 108 remains intact to define the gate structure 128 overlying the interior of the HV transistor well region(s) 108. In a similar manner as described above, portions of the photoresist material 126 overlying the other HV transistor well region 106 and the device region 102 are maintained intact to mask those regions 102, 106 from subsequent etching and ion implantation processes. As described above, in one or more embodiments, the width 127 of the remaining masking material 126 overlying the interior portion of the HV transistor well region 108 is greater than or equal to about 0.5 micrometers (or microns) to provide a gate structure 128 having a length corresponding to that width 127. In this regard, the widths of the HV transistor gate structures 120, 128 may be substantially equal to one another.

Figure 7:
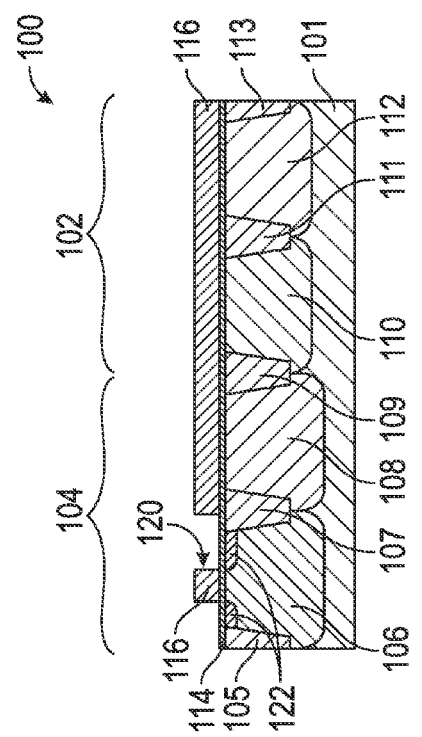
Figure 8:
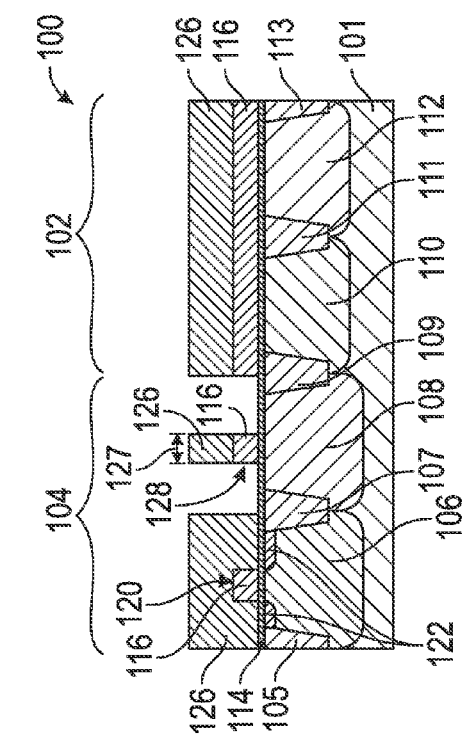

Referring now to FIGS. 7-8, in the illustrated embodiment, the patterned masking material 126 is utilized as both an etch mask for forming the gate structure 128 overlying the HV transistor well region 108 as well as an implant mask for forming source/drain extension regions 130 about the gate structure 128 within the HV transistor well region 108 prior to removing the masking material 126. In this regard, the photoresist material 126 is applied to an initial thickness (e.g., greater than 100 nm) that results in the remaining photoresist material 126 after etching the conductive material 116 having a remaining thickness that prevents the source/drain extension implantation from penetrating the gate structure 128 to the underlying channel portion of the HV transistor well region 108, in a similar manner as described above.

As depicted in FIG. 7, the illustrated fabrication process selectively removes exposed portions of the conductive material 116 using an anisotropic (or directional) etch process to form the gate structure 128 corresponding to the patterned masking material 126. In a similar manner as described above, the patterned masking material 126 prevents the anisotropic etching process from removing underlying portions of the conductive material 116 while the exposed portions of the conductive material 116 overlying the peripheral portions of the well region 108 are removed. Additionally, portions of the dielectric material 114 exposed by the patterned masking material 126 may be removed to reduce the thickness of the dielectric material 114 overlying the peripheral portions of the well region 108 to a thickness that is substantially equal to the thickness of the portions of the dielectric material 114 overlying the device region 102 and/or the portions of the dielectric material 114 overlying extension regions 122.

Referring now to FIG. 8, after etching the exposed conductive material 116 to form the gate structure 128, fabrication of the semiconductor device structure 100 continues by forming source and drain extension regions 130 about the gate structure 128 within the exposed portions of the well region 108. In this regard, P-type source and drain extension regions 130 may be formed in the N-well region 108 by implanting P-type ions (illustrated by arrows 132), such as boron ions, into the exposed N-well region 108 for the PMOS HV transistor to a desired depth and/or sheet resistivity using the gate structure 128 and the overlying masking material 126 as an implantation mask. For example, P-type ions may be implanted 132 with a dopant concentration that is greater than $1 \times 10^{16}/cm^3$, and typically between about $1 \times 10^{17}/cm^3$ to about $5 \times 10^{18}/cm^3$ at an energy level in the range of about 8 keV to about 30 keV to provide extension regions 130 having a junction depth greater than 0.1 microns. In one embodiment, the extension regions 130 have a junction depth substantially equal to 0.2 microns and a peak dopant concentration of $1\times10^{18}/cm^3$ to provide a breakdown voltage greater than 14 Volts. After forming the gate structure 128 and extension regions 130, the photoresist material 126 is removed (or stripped) by a suitable photoresist removal process.

Referring now to FIG. 9, after forming the HV transistor gate structures 120, 128 and extension regions 122, 130, the illustrated fabrication process continues by forming offset spacers 134, 136 about sidewalls of the gate structures 120, 128. In this regard, the offset spacers 134, 136 have a width configured to offset subsequently-formed source/drain regions and overlying source/drain contacts from the respective gate structures 120, 128. The sidewall spacers 134, 136 are formed by conformally depositing one or more layers of dielectric material, such a layer of nitride material or a composite of oxide and nitride layers, overlying the semiconductor device structure 100 to a desired thickness and anisotropically etching the dielectric to selectively remove portions of the dielectric material overlying the gate structures 120, 128 and the device region 102 to form the spacers 134, 136 from the dielectric material. Although not illustrated in FIG. 9, in some embodiments, prior to forming the spacers 134, 136, one or more oxidation process steps may be performed to increase the thickness of the remaining dielectric material 114 overlying the HV region 108 and/or provide a protective oxide layer along the sidewalls of the conductive material 116 of the gate structures 120, 128.

Referring now to FIGS. 10-13, after forming the source/drain offset spacers 134, 136, the illustrated fabrication process continues by forming gate structures and source/drain extension regions on the device region 102. In this regard, after forming the HV transistor gate structures 120, 128 and extension regions 122, 130 and removing the masking material 126, the illustrated fabrication process continues by forming another layer of masking material 138 overlying the semiconductor device structure 100, and patterning the masking material 138 to define gate structures 140, 142 overlying the logic transistor well regions 110, 112. In a similar manner as described above, a photoresist material 138 is applied and patterned to expose portions of the underlying conductive material 116 overlying peripheral portions of the logic transistor well regions 110, 112 while portions of the masking material 138 overlying the interior portions of the logic transistor well regions 110, 112 remain intact to define the gate structures 140, 142 overlying the interior of the logic transistor well regions 110, 112. The portion of photoresist material 138 overlying the HV region 104 is maintained intact to mask the HV region 104. In one or more embodiments, the widths 139 of the remaining masking material 138 overlying the interior portions of the logic transistor well regions 110, 112 are less than the lengths of the HV transistor gate structures 120, 128 (e.g., widths 119, 127). For example, in one or more embodiments, the widths 139 of the gate portions of the masking material 138 are configured to provide logic transistor gate structures 140, 142 that are less than or equal to about 0.05 micrometers (or microns).

Referring now to FIG. 11, the patterned masking material 138 is utilized as an etch mask to form the gate structures 140, 142. In a similar manner as described above, exposed portions of the conductive material 116 overlying the logic transistor well regions 110, 112 are selectively removed using an anisotropic (or directional) etch process to form the gate structures 140, 142 corresponding to the patterned masking material 138. In exemplary embodiments, when the thickness of the portions of dielectric material 114 surrounding the gate structures 120, 128 and overlying the HV transistor well regions 106, 108 is substantially equal to the thickness of the dielectric material 114 overlying the device region 102, portions of the dielectric material 114 exposed by the patterned masking material 138 may not be removed from the device region 102 (e.g., by configuring the anisotropic etch to effectively stop on the dielectric material 114). However, in alternative embodiments, portions of the dielectric material 114 exposed by the patterned masking material 138 may be removed to reduce the thickness of the dielectric material 114 overlying the peripheral portions of the logic transistor well regions 110, 112 to a desired thickness.

Referring now to FIG. 12, after etching the exposed conductive material 116 to form the gate structures 140, 142, fabrication of the semiconductor device structure 100 continues by removing the masking material 138, forming another layer of masking material 144 overlying the semiconductor device structure 100, patterning the masking material 144 to define a halo/extension implantation mask for a logic transistor well region 110, and forming source/drain extension regions 148 about the gate structure 140 within the exposed portions of the well region 110. In this regard, the masking material 144 is patterned to expose the P-well region(s) 110 within the device region 102 while masking the HV region 104 and the N-well region(s) 112 within the device region 102. Thereafter, N-type source and drain extension regions 148 are formed in the P-well region 110 by implanting N-type ions (illustrated by arrows 146) into the exposed P-well region 110 for the NMOS logic transistor to a desired depth and/or sheet resistivity using the gate structure 140 and the masking material 144 as an implantation mask. For example, N-type ions may be implanted 146 with a dopant concentration that is in the range of about $2\times10^{18}/cm^3$ to about $1\times10^{20}/cm^3$ at an energy level in the range of about 1 keV to about 7 keV to provide extension regions 148 having a junction depth less than 0.1 microns. In one embodiment, the extension regions 148 have a junction depth and a peak dopant concentration configured to provide a threshold voltage/of about 1.5 Volts or less. After forming the extension regions 148, the photoresist material 144 is removed. It should be noted that although FIG. 12 depicts an N-type implant, in practice, the implantation process step may involve a co-implantation (e.g., a halo/extension implantation) of both N-type (extension) and P-type (halo) species to better control the threshold voltage and the short channel effects.

Referring now to FIG. 13, fabrication of the semiconductor device structure 100 continues by forming another layer of masking material 150 overlying the semiconductor device structure 100, patterning the masking material 150 to define a halo/extension implantation mask for the other logic transistor well region(s) 112, and forming source/drain extension regions 152 about the gate structure 142 within the exposed portions of the well region 112. In this regard, the masking material 150 is patterned to expose the N-well region(s) 112 within the device region 102 while masking the HV region 104 and the P-well region(s) 110 within the device region 102. Thereafter, P-type source and drain extension regions 152 are formed in the N-well region(s) 112 by implanting P-type ions (illustrated by arrows 154) into the exposed N-well region(s) 112 for the PMOS logic transistor(s) to a desired depth and/or sheet resistivity using the gate structure 142 and the masking material 150 as an implantation mask. For example, P-type ions may be implanted 154 with a dopant concentration that is in the range of about $2\times10^{18}/cm^3$ to about $1\times10^{20}/cm^3$ at an energy level in the range of about 1 kiloelectron volt (keV) to about 2 keV to provide extension regions 152 having a junction depth less than 0.1 microns. After forming the extension regions 152, the photoresist material 150 is removed. Again, it should be noted that although FIG. 13 depicts a P-type implant, in practice, the implantation process step may involve a co-implantation (e.g., a halo/extension implantation) of both P-type (extension) and N-type (halo) species.

Turning now to FIG. 14, in exemplary embodiments, after forming the logic transistor gate structures 140, 142 and extension regions 148, 152, the fabrication of the semiconductor device structure 100 continues by forming offset spacers 156, 158 about sidewalls of the gate structures 140, 142 having a width configured to offset subsequently-formed source/drain regions and overlying source/drain contacts from the respective gate structures 140, 142. Although not illustrated in FIG. 14, in practice, offset spacers may also be formed about the sidewalls of spacers 134, 136 concurrently to forming offset spacers 156, 158, such that the combination of two sidewall spacers define the offset of the source/drain regions about gate structures 120, 128 on the HV region 104 while single sidewall spacers 156, 158 define the offset for the device region 102. Thereafter, source/drain regions 160, 162, 164, 166 may be formed within the respective extension regions 122, 130, 148, 152 and/or the respective well regions 106, 108, 110, 112. For example, the N-well regions 108, 112 on the substrate 101 may be masked with a photoresist material that is patterned to expose the P-well regions 106, 110, and N-type source and drain regions 160, 164 are formed in the N-type extension regions 122, 148 and/or P-well regions 106, 110 by implanting N-type ions to a desired depth and/or sheet resistivity using the gate structures 120, 140, the offset spacers 134, 156 and the photoresist material as an implantation mask. For example, N-type ions may be implanted with a dopant concentration that is in the range of about $1\times10^{19}/cm^3$ to about $1\times10^{21}/cm^3$ at an energy level in the range of about 10 keV to about 30 keV to provide source/drain regions 160, 164 having a depth greater than the logic transistors extension regions, etc. In this regard, source/drain regions 160 for the N-type HV transistors may be formed concurrently to formation of the source/drain regions 164 for the N-type logic transistors. After forming the source/drain regions 160, 164, the photoresist material may be removed and P-type source/drain regions 162, 166 may be formed in a similar manner. For example, the P-well regions 106, 110 on the substrate 101 may be masked with a photoresist material that is patterned to expose the N-well regions 108, 112, and P-type source and drain regions 160, 164 are formed in the P-type extension regions 130, 152 and/or N-well regions 108, 112 by implanting P-type ions to a desired depth and/or sheet resistivity using the gate structures 128, 142, the offset spacers 136, 158 and the photoresist material as an implantation mask. In this regard, source/drain regions 162 for the P-type HV transistors may be formed concurrently to formation of the source/drain regions 166 for the P-type logic transistors. After forming the source/drain regions 160, 162, 164, 166, fabrication of the semiconductor device structure 100 may be completed using well known final process steps (e.g., back end of line (BEOL) process steps), which will not be described in detail herein.

FIGS. 15-18 illustrate, in cross-section, an alternative embodiment of a fabrication process to form gate structures and extension regions for HV transistors on a HV region 204 of a substrate 201, where the extension regions have a junction depth greater than the height (or thickness) of the HV transistor gate structures. In a similar manner as described above, the semiconductor device structure 200 of FIGS. 15-18 includes a device region 202 of a semiconductor substrate 201 having logic transistors configured to provide a desired functionality for the semiconductor device structure 200, and a HV region 204 of the semiconductor substrate 201 having HV transistors configured to support the functionality of the transistor structures on the device region 202. In a similar manner, as described above, well regions 206, 208, 210, 212 and isolation regions 205, 207, 209, 211, 213 are formed in the substrate 201, before forming one or more layers of dielectric material 214 overlying the semiconductor substrate 201 and forming one or more layers of conductive material 216 overlying the dielectric material 214.

Referring to FIGS. 15-16, a layer of masking material 218 is formed overlying the layer of conductive material 116 and patterned to define the lateral boundaries of the extension regions 122 to be formed in a HV transistor well region 206 of a first conductivity type, while portions of the masking material 218 overlying the device region 202 and the HV transistor well region 208 having the opposite conductivity type are maintained intact. In exemplary embodiments, the masking material 218 is realized as a photoresist material that is uniformly applied across the semiconductor device structure 200 and patterned to remove portions of the photoresist material 218 overlying the peripheral portions of the well region 206, while the portion of the photoresist material 218 overlying the interior (or central) portion of the HV transistor well region 106 remains intact to define the channel region for the HV transistor. In this regard, the width 219 of the remaining photoresist material 218 overlying the interior portion of the HV transistor well region 206 is configured to provide a channel region within the well region 206 having a channel length that corresponds to the width 219. In exemplary embodiments described herein, the length of the channel region (or the width 219) is equal to or greater than 0.5 micrometers (micron). It will be appreciated that the length of the channel region corresponds to the separation distance between the interior lateral boundaries of the extension regions 222.

Referring now to FIG. 16, in the illustrated embodiment, the patterned masking material 218 is utilized as an implant mask for forming source/drain extension regions 222 prior to etching the conductive material 216 to form the gate structure 220 overlying the HV transistor well region 206. In a similar manner as described above, the photoresist material 218 is applied to a thickness that prevents the source/drain extension implantation from penetrating the underlying conductive material 216 and undesirably doping the underlying channel portion of the HV transistor well region 206. N-type source and drain extension regions 222 are formed within the exposed portions of the P-well region 206 by implanting N-type ions (illustrated by arrows 224) into the exposed well region 206 for the NMOS HV transistor to a desired depth and/or sheet resistivity using the photoresist material 218 as an implantation mask. For example, N-type ions may be implanted 224 with a dopant concentration that is greater than $1\times10^{16}/cm^3$, and typically between about $1\times10^{17}/cm^3$ to about $5\times10^{18}/cm^3$ at an energy level in the range of about 40 keV to about 80 keV to penetrate the exposed portions of conductive material 216 and dielectric material 214 and provide extension regions 222 having a junction depth greater than 0.1 microns. In one embodiment, the extension regions 222 have a junction depth substantially equal to 0.2 microns and a peak dopant concentration of $2\times10^{18}/cm^3$ to provide a breakdown voltage greater than 14 Volts. As described above, in some embodiments, the junction depth of the extension regions 222 is greater than the combined thickness of the dielectric material 214 and the conductive material 216.

Figure 17:
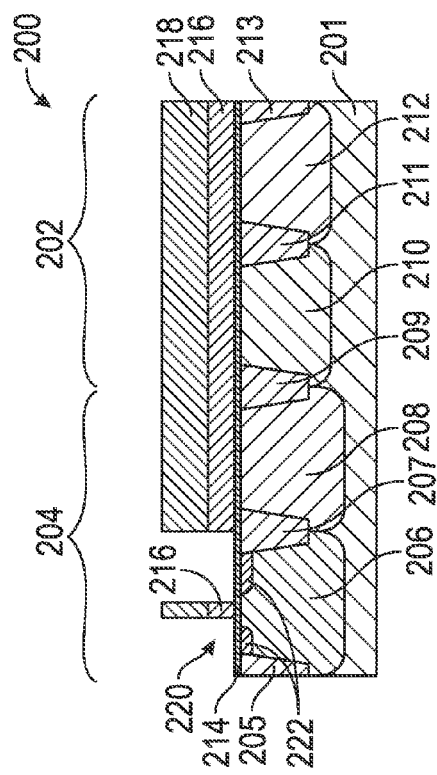
Figure 18:
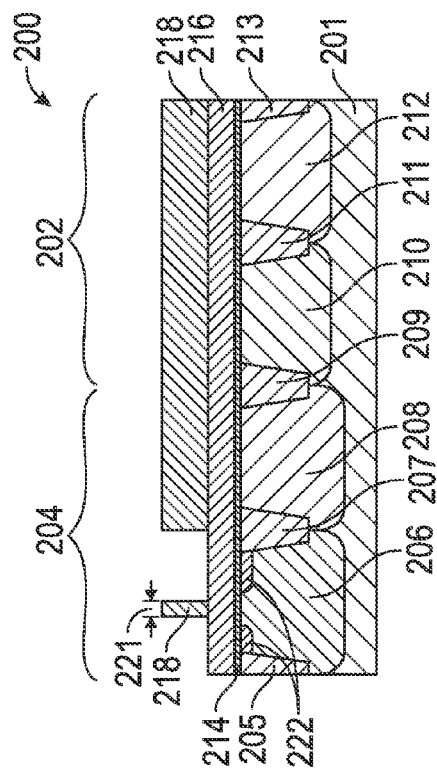

Referring now to FIGS. 17-18, after forming the source/drain extension regions 222, the fabrication process continues by etching portions of the conductive material 216 exposed by the masking material 218 to form the gate structure 220 overlying the channel portion of the HV transistor well region 206. In one or more embodiments, prior to performing the etch process, the fabrication process removes exterior portions of the masking material 218 that overlies the HV transistor well region 206 to reduce the width of the portion of the masking material 218 corresponding to the gate structure 220 from the initial width 219 used for the source/drain extension regions 222 to a narrower (or lesser) width 221 to be used for the gate structure 220. For example, an additional ashing process step may be performed to reduce the width 219 of the photoresist material 218. In this manner, the source/drain extension regions 222 are effectively laterally offset from the gate structure 220 by the difference between the initial width 219 and the subsequent width 221 that corresponds to the length of the gate structure 220. In exemplary embodiments, the width 221 of the remaining photoresist material 218 is configured to provide a gate structure 220 having a length of about 0.5 micrometers (or microns). Thus, the resist trimming process may reduce the width of the masking portion of the photoresist material 218 overlying the well region 206 from an initial width 219 of about 0.7 microns to a width 221 of about 0.5 microns to laterally offset the lateral boundaries of the source/drain extension regions 222 from a respective sidewall of the gate structure 220 by an offset distance of about 0.1 microns (neglecting any lateral diffusion of the source/drain extension regions 222). In a similar manner as described above, the fabrication process selectively removes exposed portions of the conductive material 216 using an anisotropic (or directional) etch process to form the gate structure 220 with a length corresponding to the width 221 of the patterned photoresist material 218. Additionally, in some embodiments, portions of the exposed dielectric material 214 may also be removed to achieve a desired thickness for the portions of the dielectric material 214 overlying the well region 206 that are not part of the gate structure 220.

After forming the gate structure 220, the photoresist material 218 is removed and the fabrication process steps for forming the gate structure 220 and extension regions 222 are repeated in an equivalent manner to form a gate structure and extension regions for the other HV transistor well region(s) 208 on the HV region 204. In this regard, another layer of photoresist is applied and patterned to define the channel region within the N-well region 208 and P-type ions are implanted into the N-well region 208 to form P-type source/drain extension regions before etching exposed portions of the conductive material 216 to form a gate structure overlying the channel portion of the N-type HV transistor well region 208. In a similar manner as described above, a resist trimming process may be performed to reduce the length of the gate structure and offset the P-type source/drain extensions from the gate structure. In this regard, in some embodiments, the length of the gate structure overlying the N-well region 208 may be different than the length of the gate structure 220 overlying the P-well region 206, and/or the amount of lateral offset between the P-type extensions and the gate structure overlying the N-well region 208 may be different than the lateral offset between the N-type extension regions 222 and the gate structure 220. Thereafter, fabrication of the semiconductor device structure 200 may be completed by forming offset spacers on the HV region 204 (e.g., as described above in the context of FIG. 9), forming gate structures and source/drain extension regions on the device region 202 (e.g., as described above in the context of FIGS. 10-13), forming source/drain regions in the well regions 206, 208, 210, 212 (e.g., as described above in the context of FIG. 14), and performing other BEOL fabrication process steps as desired.

In one or more embodiments, the fabrication process of FIG. 1-14 may be implemented in conjunction with the fabrication process of FIGS. 15-18. For example, the fabrication process steps of FIGS. 1-5 may be performed to fabricate one or more HV transistors with self-aligned source/drain extension regions on the HV region of a substrate. Thereafter, the fabrication process steps of FIGS. 15-18 may be performed (e.g., in lieu of the fabrication process steps of FIGS. 6-8) to fabricate HV transistors of the opposite conductivity with gate structures offset from the source/drain extension region implants on the HV region of the substrate. Thereafter, fabrication may be completed by forming offset spacers on the HV region (e.g., as described above in the context of FIG. 9), forming gate structures and source/drain extension regions on the logic region of the substrate (e.g., as described above in the context of FIGS. 10-13), concurrently forming source/drain regions in the HV region and logic region of the substrate (e.g., as described above in the context of FIG. 14), and performing other BEOL fabrication process steps as desired.

For the sake of brevity, conventional techniques related to semiconductor and/or integrated circuit fabrication, power transistors, memory devices, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context.

The foregoing detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the foregoing detailed description.

In conclusion, methods and devices configured in accordance with example embodiments of the invention relate to:

An embodiment of a method of fabricating one or more semiconductor devices on a semiconductor substrate is provided. The method comprises forming a layer of gate electrode material overlying the semiconductor substrate, forming a layer of masking material overlying the gate electrode material, and patterning the layer of masking material to define a channel region within a well region in the semiconductor substrate that underlies the gate electrode material. Prior to removing the patterned layer of masking material, the method etches the layer of gate electrode material to form a gate structure overlying the channel region using the patterned layer of masking material as an etch mask, forms extension regions in the well region using the patterned layer of masking material as an implant mask, and removes the patterned layer of masking material after forming the gate structure and the extension regions. In one embodiment, patterning the layer of masking material comprises removing portions of the layer of masking material to obtain a portion of masking material overlying the channel region, and etching the layer of gate electrode material comprises etching the layer of gate electrode material to form the gate structure aligned with the portion of masking material. In further embodiments, forming the extension regions comprises implanting ions into the well region using the portion of masking material and the gate structure as the implant mask after etching the layer of gate electrode material, and implanting ions comprises implanting the ions to a depth relative to a surface of the semiconductor substrate that is greater than a height of the gate structure. In another embodiment, forming the extension regions comprises forming the extension regions with a junction depth greater than a thickness of the layer of the gate electrode material, wherein etching the layer of gate electrode material comprises etching the layer of gate electrode material to form the gate structure aligned with a portion of masking material and forming the extension regions comprises implanting ions into the well region using the portion of masking material and the gate structure as the implant mask after etching the layer of gate electrode material to form the gate structure. In yet another embodiment, forming the extension regions comprises forming the extension regions with a junction depth greater than a height of the gate structure. In another embodiment, patterning the layer of masking material comprises removing portions of the layer of masking material to obtain a portion of masking material overlying the channel region, and forming the extension regions comprises implanting ions into the well region using the portion of masking material as the implant mask to form the extension regions prior to etching the layer of gate electrode material. In one embodiment, the method further comprises reducing a width of the portion of the masking material after forming the extension regions, wherein etching the layer of gate electrode material comprises etching the layer of gate electrode material to form the gate structure aligned with the portion of masking material after reducing the width of the portion of the masking material.

In accordance with yet another embodiment, the patterned layer of masking material masks a second well region in the semiconductor substrate underlying the gate electrode material, where the method further comprises forming a second layer of masking material overlying the extension regions, the gate structure, and the second well region after removing the patterned layer of masking material, patterning the second layer of masking material to define a second channel region within the second well region to provide a second patterned layer of masking material that masks the well region. Prior to removing the second patterned layer of masking material, the method etches the layer of gate electrode material overlying the second well region to form a second gate structure overlying the second channel region using the second patterned layer of masking material as a second etch mask, forms second extension regions in the second well region using the second patterned layer of masking material as a second implant mask, and removes the second patterned layer of masking material after forming the second gate structure and the second extension regions. In one embodiment, the method further comprises masking the well region and the second well region while forming a plurality of gate structures and a plurality of extension regions in a device region of the semiconductor substrate.

Another method of fabricating a plurality of transistors on a semiconductor substrate comprises forming a layer of gate electrode material overlying the semiconductor substrate, forming a first layer of photoresist material overlying the gate electrode material, and patterning the first layer of photoresist material to define a first channel region within a first well region in the semiconductor substrate corresponding to a first transistor of the plurality of transistors while masking a second well region in the semiconductor substrate corresponding to a second transistor of the plurality of transistors. Prior to removing the first patterned layer of photoresist material, the method continues by etching the layer of gate electrode material overlying the first well region to form a first gate structure of the first transistor overlying the first channel region using the first patterned layer of photoresist material as a first etch mask, forming first extension regions of the first transistor in the first well region using the first patterned layer of photoresist material as a first implant mask, and removing the first patterned layer of photoresist material after forming the first gate structure and the first extension regions. In one embodiment, the method further comprises forming a second layer of photoresist material overlying the semiconductor substrate and patterning the second layer of photoresist material to define a second channel region within the second well region while masking the first gate structure and the first extension regions in the first well region to obtain a second patterned layer of photoresist material. Prior to removing the second patterned layer of photoresist material, the method continues by etching the layer of gate electrode material overlying the second well region to form a second gate structure of the second transistor overlying the second channel region using the second patterned layer of photoresist material as a second etch mask, forming second extension regions in the second well region using the second patterned layer of photoresist material as a second implant mask, and removing the second patterned layer of photoresist material after forming the second gate structure and the second extension regions.

In another embodiment, the method further comprises forming a layer of dielectric material overlying the semiconductor substrate, wherein forming the layer of gate electrode material overlying the semiconductor substrate comprises forming a layer of conductive material overlying the layer of dielectric material and the first gate structure includes a first portion of the layer of dielectric material aligned with the first etch mask and a second portion of the layer of conductive material aligned with the first etch mask, the second portion overlying the first portion. In one embodiment, forming the layer of dielectric material comprises forming the layer of dielectric material to a first thickness, forming the layer of conductive material comprises forming the layer of conductive material to a second thickness, and forming the first extension regions comprises forming the first extension regions in the first well region to a depth greater than a sum of the first thickness and the second thickness. In a further embodiment, forming the first layer of photoresist material comprises forming the first layer of photoresist material to a third thickness, and a second sum of the first thickness, the second thickness, and the third thickness is greater than the depth of the first extension regions. In another embodiment, forming the first extension regions comprises implanting ions into exposed portions of the first well region after etching the layer of gate electrode material to form the first gate structure. In yet another embodiment, forming the first extension regions comprises implanting ions into portions of the first well region exposed by the first patterned layer of photoresist material using a portion of the first patterned layer overlying the first channel region as the first implant mask prior to etching the layer of gate electrode material to form the first gate structure. In one embodiment, the method further comprises reducing a width of the portion of the first patterned layer of photoresist material after forming the first extension regions, wherein etching the layer of gate electrode material comprises etching the layer of gate electrode material to form the first gate structure aligned with the portion of the first patterned layer after reducing the width of the portion of the first patterned layer.

An embodiment of a semiconductor device is also provided. The semiconductor device comprises a first transistor structure and a second transistor structure. The first transistor structure comprises a first well region of semiconductor material having a first conductivity type and a first depth, a first gate structure overlying the first well region, and first extension regions having a second conductivity type within the first well region. The first gate structure comprises a first portion of dielectric material having a first thickness overlying the first well region and a second portion of conductive material having a second thickness overlying the first portion. Interior lateral boundaries of the first extension regions are vertically aligned with the first gate structure, wherein a junction depth of the first extension regions is greater than a sum of the first thickness and the second thickness. The second transistor structure comprises a second well region of semiconductor material having the first conductivity type and a second depth less than the first depth, a second gate structure overlying the second well region, and second extension regions having the second conductivity type within the second well region. The second gate structure comprises a third portion of dielectric material having a third thickness overlying the second well region and a fourth portion of the conductive material having the second thickness overlying the third portion, wherein a depth of the second extension regions is less than a sum of the third thickness and the second thickness.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A method of fabricating one or more semiconductor devices on a semiconductor substrate, the method comprising:
    forming a layer of gate electrode material overlying the semiconductor substrate;
    forming a layer of masking material overlying the gate electrode material;
    patterning the layer of masking material to define a channel region within a well region in the semiconductor substrate by removing portions of the layer of masking material to obtain a portion of masking material overlying the channel region, wherein the well region underlies the gate electrode material,
    said patterning the layer of masking material comprises removing portions of the layer of masking material to obtain a portion of masking material overlying the channel region;
    prior to removing the patterned layer of masking material:
        etching the layer of gate electrode material to form a gate structure vertically aligned with the portion of masking material overlying the channel region, and
        implanting ions into the well region using the portion of masking material as an implant mask to form extension regions having internal lateral boundaries vertically aligned with the gate structure in the well region, prior to said etching the layer of gate electrode material, and
        reducing a width of the portion of the masking material after said forming the extension regions and before said etching the layer of gate electrode material; and
        removing the patterned layer of masking material after forming the gate structure and the extension regions.

2. The method of claim 1, wherein implanting ions comprises implanting the ions to a depth relative to a surface of the semiconductor substrate that is greater than a height of the gate structure.

3. The method of claim 1, wherein implanting ions comprises forming the extension regions with a junction depth greater than a thickness of the layer of the gate electrode material.

4. The method of claim 1, wherein implanting ions comprises forming the extension regions with a junction depth greater than a height of the gate structure.

5. A method of fabricating one or more semiconductor devices on a semiconductor substrate, the method comprising:
    forming a layer of gate electrode material overlying the semiconductor substrate;
    forming a layer of masking material overlying the gate electrode material;
    patterning the layer of masking material to define a channel region within a well region in the semiconductor substrate, the well region underlying the gate electrode material, the patterned layer of masking material masking a second well region in the semiconductor substrate underlying the gate electrode material;
    prior to removing the patterned layer of masking material:
        etching the layer of gate electrode material to form a gate structure overlying the channel region using the patterned layer of masking material as an etch mask; and
        forming extension regions in the well region using the patterned layer of masking material as an implant mask; and
    removing the patterned layer of masking material after forming the gate structure and the extension regions;
    forming a second layer of masking material overlying the extension regions, the gate structure, and the second well region after removing the patterned layer of masking material;
    patterning the second layer of masking material to define a second channel region within the second well region, resulting in a second patterned layer of masking material that masks the well region;
    prior to removing the second patterned layer of masking material:
        etching the layer of gate electrode material overlying the second well region to form a second gate structure overlying the second channel region using the second patterned layer of masking material as a second etch mask; and forming second extension regions in the second well region using the second patterned layer of masking material as a second implant mask; and removing the second patterned layer of masking material after forming the second gate structure and the second extension regions.

6. The method of claim 5, wherein:

patterning the layer of masking material comprises removing portions of the layer of masking material to obtain a portion of masking material overlying the channel region; and etching the layer of gate electrode material comprises etching the layer of gate electrode material to form the gate structure aligned with the portion of masking material.

7. The method of claim 6, wherein forming the extension regions comprises implanting ions into the well region using the portion of masking material and the gate structure as the implant mask after etching the layer of gate electrode material.

8. The method of claim 5, further comprising masking the well region and the second well region while forming a plurality of gate structures and a plurality of extension regions in a device region of the semiconductor substrate.

9. A method of fabricating a plurality of transistors on a semiconductor substrate, the method comprising:

forming a layer of gate electrode material overlying the semiconductor substrate;

forming a first layer of photoresist material overlying the gate electrode material;

patterning the first layer of photoresist material to define a first channel region within a first well region in the semiconductor substrate corresponding to a first transistor of the plurality of transistors while masking a second well region in the semiconductor substrate corresponding to a second transistor of the plurality of transistors, resulting in a first patterned layer of photoresist material;

prior to removing the first patterned layer of photoresist material:

etching the layer of gate electrode material overlying the first well region to form a first gate structure of the first transistor using the first patterned layer of photoresist material as a first etch mask, the first gate structure overlying the first channel region; and forming first extension regions of the first transistor in the first well region using the first patterned layer of photoresist material as a first implant mask;

removing the first patterned layer of photoresist material after forming the first gate structure and the first extension regions.

10. The method of claim 9, further comprising:

forming a second layer of photoresist material overlying the semiconductor substrate;

patterning the second layer of photoresist material to define a second channel region within the second well region while masking the first gate structure and the first extension regions in the first well region, resulting in a second patterned layer of photoresist material;

prior to removing the second patterned layer of photoresist material:

etching the layer of gate electrode material overlying the second well region to form a second gate structure of the second transistor using the second patterned layer of photoresist material as a second etch mask, the second gate structure overlying the second channel region; and forming second extension regions in the second well region using the second patterned layer of photoresist material as a second implant mask;

removing the second patterned layer of photoresist material after forming the second gate structure and the second extension regions.

11. The method of claim 9, further comprising forming a layer of dielectric material overlying the semiconductor substrate, wherein:

forming the layer of gate electrode material overlying the semiconductor substrate comprises forming a layer of conductive material overlying the layer of dielectric material; and the first gate structure includes a first portion of the layer of dielectric material aligned with the first etch mask and a second portion of the layer of conductive material aligned with the first etch mask, the second portion overlying the first portion.

12. The method of claim 11, wherein:

forming the layer of dielectric material comprises forming the layer of dielectric material to a first thickness;

forming the layer of conductive material comprises forming the layer of conductive material to a second thickness; and forming the first extension regions comprises forming the first extension regions in the first well region to a depth greater than a sum of the first thickness and the second thickness.

13. The method of claim 12, wherein:

forming the first layer of photoresist material comprises forming the first layer of photoresist material to a third thickness; and a second sum of the first thickness, the second thickness, and the third thickness is greater than the depth of the first extension regions.

14. The method of claim 12, wherein forming the first extension regions comprises implanting ions into exposed portions of the first well region after etching the layer of gate electrode material to form the first gate structure.

15. The method of claim 12, wherein forming the first extension regions comprises implanting ions into portions of the first well region exposed by the first patterned layer of photoresist material using a portion of the first patterned layer overlying the first channel region as the first implant mask prior to etching the layer of gate electrode material to form the first gate structure.

16. The method of claim 15, further comprising reducing a width of the portion of the first patterned layer of photoresist material after forming the first extension regions, wherein etching the layer of gate electrode material comprises etching the layer of gate electrode material to form the first gate structure aligned with the portion of the first patterned layer after reducing the width of the portion of the first patterned layer.

17. The method of claim 10, wherein:

forming first extension regions comprises forming the first extension regions to a first depth;

forming the second extension regions comprises forming the second extension regions to a second depth;

the first depth is greater than a height of the first gate structure; and the first depth is greater than the second depth.

* * * * *